United States Patent [19]
Austin

[11] Patent Number: 5,833,480
[45] Date of Patent: *Nov. 10, 1998

[54] STANDOFF GROUND CONNECTOR

[75] Inventor: Ronald Austin, Westchester, Ill.

[73] Assignee: Illinois Tool Works Inc., Glenview, Ill.

[*] Notice: The term of this patent shall not extend beyond the expiration date of Pat. No. 5,707,244.

[21] Appl. No.: 799,110

[22] Filed: Feb. 11, 1997

Related U.S. Application Data

[63] Continuation-in-part of Ser. No. 675,686, Jul. 3, 1996, Pat. No. 5,707,244.

[51] Int. Cl.$^6$ ........................................................ H01R 4/66

[52] U.S. Cl. ............................... 439/95; 361/816; 24/453; 24/295

[58] Field of Search .................................. 439/95–97, 92; 174/35 GC, 35 R; 361/816; 24/453, 295, 293

[56] References Cited

U.S. PATENT DOCUMENTS 5,600,092  2/1997  Patscheck et al. .................. 174/35 GC Primary Examiner—Gary F. Paumen
Attorney, Agent, or Firm—Kane,Dalsimer,Sullivan, Kurucz, Levy, Eisele and Richard, LLP

[57] ABSTRACT

A standoff ground connector for mounting a circuit board to a chassis in a piece of electronic equipment in a standoff grounded position relative thereto includes two pre-load form members, each including two opposed shanks with support portions for the circuit board. A mounting device including an arrowhead shaped portion and a contiguous portion of reduced width forms a detent mounting device for the circuit board. Inward and outward flexing of the arrowhead shaped portion causes the support portions of the pre-load form members to perform a wiping motion. Therefore, as the aperture of the circuit board moves from the arrowhead shaped portion into the detent position within the portion of reduced width, the pre-load form members perform this wiping motion.

9 Claims, 4 Drawing Sheets

STANDOFF GROUND CONNECTOR

This application is a continuation-in-part of U.S. patent application Ser. No. 08/675,686, filed on Jul. 3, 1996, now U.S. Pat. No. 5,707,244 issued Jan. 13, 1998.

BACKGROUND OF THE INVENTION

1. Field of the Invention

The present invention relates to electronic equipment, and specifically to personal computers. More particularly, the invention is a standoff ground connector for mounting a circuit board on the chassis within the cabinet of a personal computer.

2. Description of the Prior Art

Circuit boards in electronic equipment, such as personal computers, typically must be mounted on a chassis within the equipment and electrically grounded thereto. Often there is an additional requirement to mount the circuit board in a position separated from and parallel to the chassis. The mounting means used for this latter purpose are referred to as standoffs.

In the prior art, standoffs have generally comprised threaded members, such as screws or threaded rods, directed upward through the chassis and through unthreaded collars or sleeves. The circuit board, in turn, provided with mounting holes, are attached to the threaded members by nuts, and are separated from the chassis by a distance equal to the length of the collars or sleeves.

It will be clear that several standoffs, amounting to a number of small individual parts, are required to mount a single circuit board. Accordingly, there is a need for a simple standoff connector with fewer parts to carry out the mounting of circuit boards in electronic equipment in standoff positions. At the same time, the standoff connector must form a secure electrical connection to the circuit board and chassis to effectively and reliably ground the circuit board to the chassis. These needs are met by the standoff ground connector of the present invention.

SUMMARY OF THE INVENTION

Accordingly, the present invention is a standoff ground connector for mounting a circuit board to a chassis in a piece of electronic equipment in a standoff grounded position relative thereto. The standoff ground connector includes mounting device which includes an upwardly pointing resilient arrowhead shaped member which is directed through an aperture in the circuit board, followed by a portion of decreased width for detent engagement of the circuit board through the aperture therein.

A first leg and a second leg extend from the support platform in a direction opposite to that of the arrowhead shaped mounting member. The legs include means for attaching the standoff ground connector fixedly to the chassis. The attaching means may be a foot on each of the two legs, and adjacent to the foot on each leg, but separated therefrom, a wedge-shaped locking member, whose base is closest to the foot and which is oriented on the leg in a direction toward the support platform.

The standoff ground connector preferably includes two pre-load form members extending between the first and second legs. Each pre-load form member has two shanks which extend from the legs upwardly toward each other to form a gap therebetween and then extend horizontally away from each other. The horizontal portions of the shanks of the pre-load form members form a support platform for the circuit board. The shanks are resilient so that they can be urged toward or away from each other thereby varying the size of the gap therebetween and effecting a "wiping" motion to achieve an improved electrical connection with the circuit board.

The circuit board is engaged by placing the arrowhead shaped mounting member into an aperture of the circuit board. As the circuit board passes over the broadest portion of the arrowhead shaped mounting member, the resilient walls of the mounting member are urged toward each other. This, in turn, urges the shanks of the pre-load form members toward each other. As the circuit board passes to the portion of reduced width of the mounting device, the resilient walls of the arrowhead shaped mounting member flex outward thereby detent engaging the circuit board and further causing an outward horizontal flexing of the shanks further causing a "wiping" motion of the shanks, which form the support platform, across the circuit board thereby forming an improved electrical connection.

The present invention will now be described in more complete detail with frequent reference being made to the figures identified below.

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
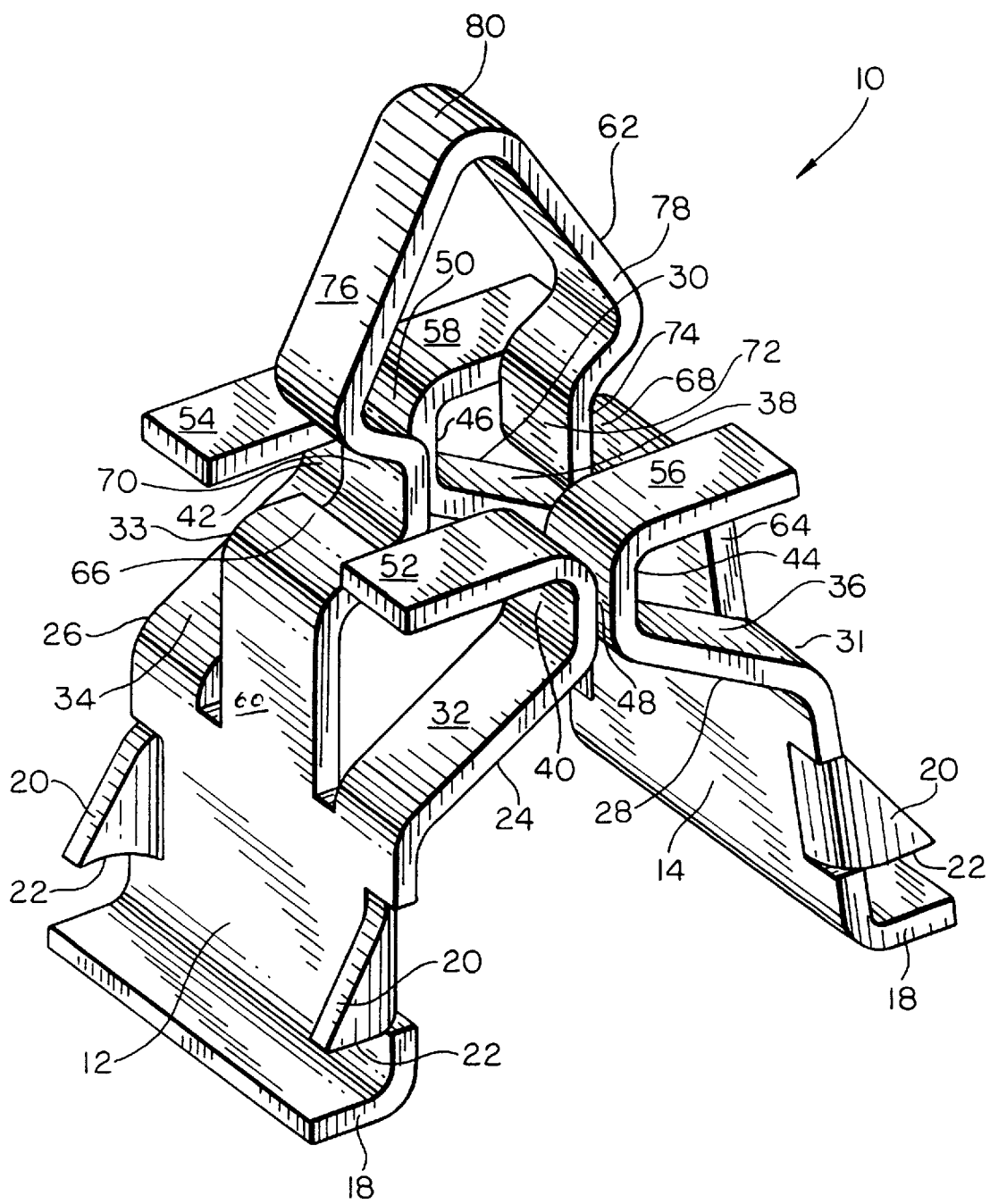
FIG. 1 is a perspective view of the standoff ground connector of the present invention.

Referring now to the drawings in detail wherein like numerals refer to like elements throughout the several views, one sees that FIG. 1 is a perspective view of the standoff ground connector 10 of the present invention. The standoff ground connector 10 comprises a first leg 12 and a second leg 14 extending essentially parallel to one another.

Each leg 12, 14 has a foot 18, and, spaced above foot 18, at least one, and preferably two, wedge-shaped locking members 20. Where two such locking members 20 are provided on a leg 12, 14, they are provided on opposite sides thereof. Wedge-shaped locking members 20 are preferably placed on an outward edge of legs 12, 14 with bases 22 closest to feet 18. Feet 18 are oriented away from one another in opposite directions.

The outer portions of first leg 12 are integral with shanks 24, 26. Similarly, the outer portions of second leg 14 are integral with shanks 28, 30. Shanks 24, 28 form first pre-load form member 31, while shanks 26, 30 form second pre-load form member 33. Shanks 24, 26, 28, 30 include inwardly directed oblique portions 32, 34, 36, 38, respectively, which curve upwardly into vertical portions 40, 42, 44, 46, respectively. In an unbiased position, gap 48 is formed between vertical portions 40, 44 and gap 50 is formed between vertical portions 42, 46. Vertical portions 40, 42, 44, 46 curve outwardly to form horizontal portions 52, 54, 56, 58, respectively. These horizontal portions form a support platform for the circuit board 100.

The inner portion of leg 12 is integral with upwardly extending prong 60 of the arrowhead shaped mounting device 62. Similarly, the inner portion of leg 14 is integral with upwardly extending prong 64 of the arrowhead shaped mounting device 62.

The arrowhead shaped mounting device 62 further includes horizontal portions 66, 68 extending inwardly from upwardly extending prongs 60, 64, respectively. Horizontal portions 66, 68 curve upwardly to form vertical portions 70, 72, respectively, which further forms a portion of reduced width 74 of the arrowhead shaped mounting device 62. Portion of reduced width 74 is sized in its unbiased condition to be somewhat larger than the aperture 102 of the circuit board 100 into which it is to be inserted. Therefore, particularly in consideration of the resilient nature of arrowhead shaped mounting device 62, when the aperture 102 of the circuit board 100 is engaged by portion of reduced width 74, a detent engagement is formed (see FIGS. 4 and 5). Additionally, an inward or outward motion of vertical portions 70, 72 which varies the portion of reduced width 72 will effect a horizontal "wiping" movement of horizontal portions 52, 54, 56, 58 of preload form members 31, 33.

Arrowhead shaped mounting device 62 further includes walls 76, 78 which extend obliquely upwardly and outwardly from vertical portions 70, 72, and then extend obliquely upwardly and inwardly to form apex 80.

The standoff ground connector 10 may be integrally formed from a rectangular piece of metal sheet material by stamping, cutting and shaping it into the form it assumes in the figures. For example, the connector 10 may be fashioned from a rectangular piece of tin-plated stainless steel, although electrically conducting sheet material of any other type may be used so long as it can be worked into a shape like that shown in FIG. 1.

Figure 2:
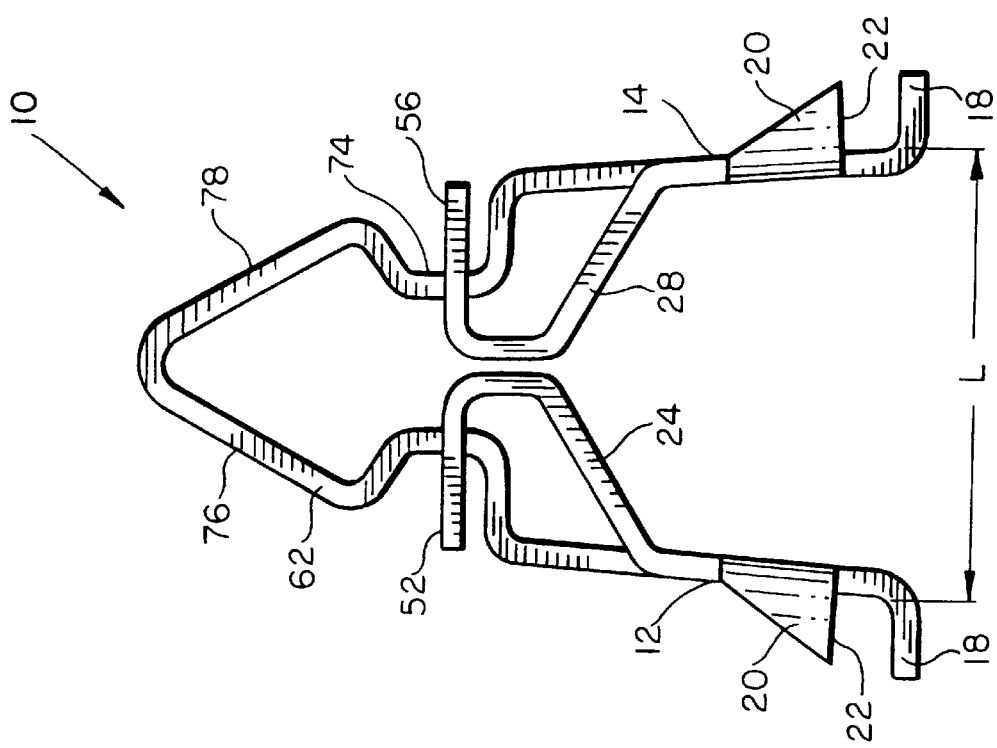
FIG. 2 is a side plan view of the connector.

FIG. 2 is a side plan view of the standoff ground connector 10, the opposite side being identical to the side shown. Further, wedge-shaped locking members 20 are spaced on legs 12, 14 from feet 18, and extend outward therefrom in the same directions as their respective feet 18. Bases 22 are closest to feet 18, while wedge-shaped locking members 20 themselves point along legs 12, 14 toward support platform 16. Finally, legs 12, 14 are substantially parallel to one another, and have outward facing surfaces separated from one another by length L.

Figure 3:
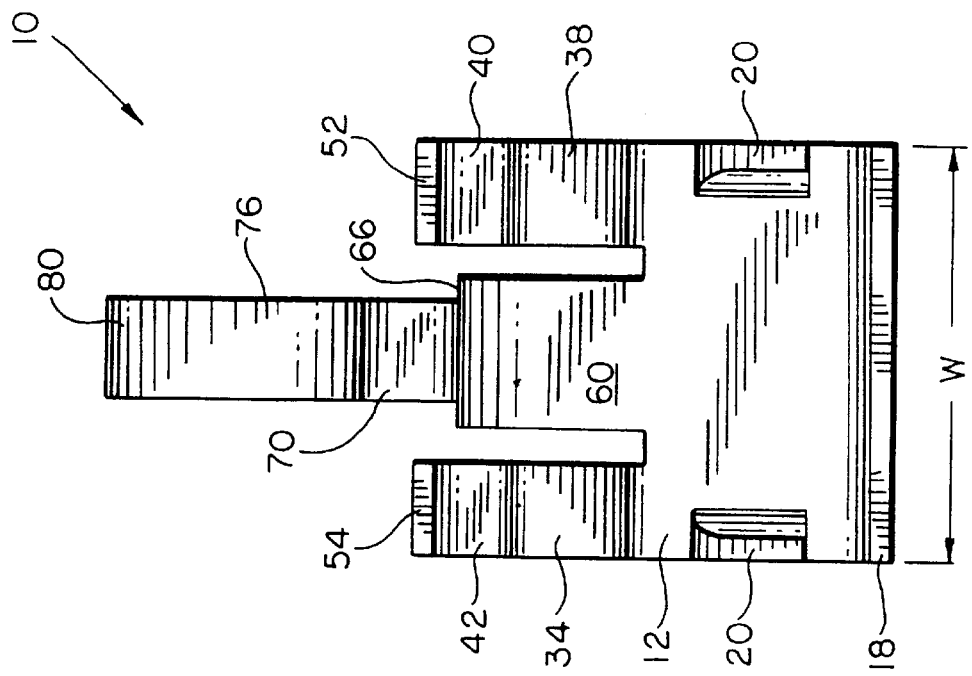
FIG. 3 is a front plan view thereof.

FIG. 3 is a front plan view of the standoff ground connector 10, the back side being identical to the front side. First leg 12, as well as second leg 14, not shown in FIG. 3, are of width W.

Figure 4:
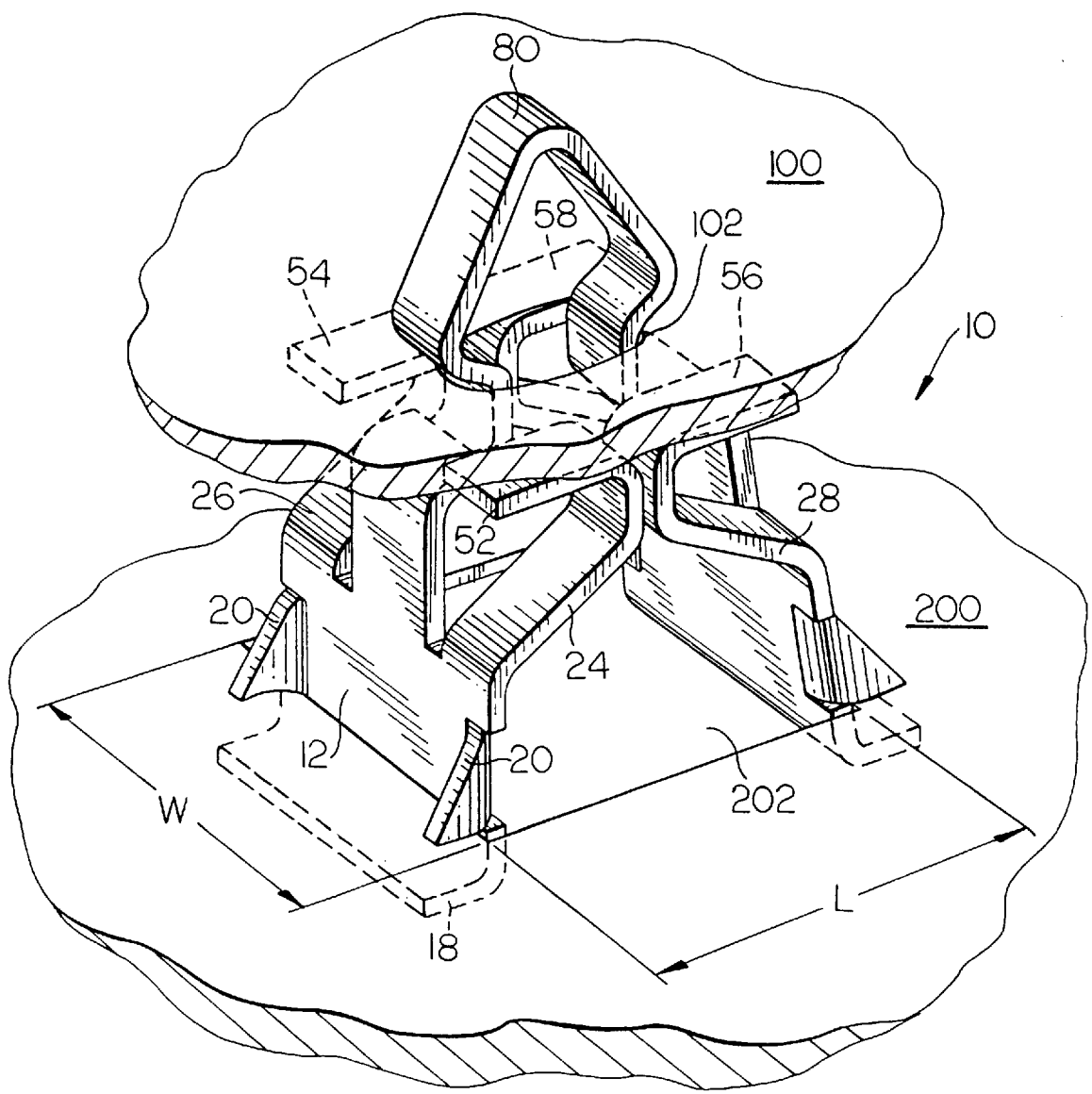
FIG. 4 is a perspective view of the connector in use in a piece of electronic equipment.

FIG. 4 is a perspective view of the standoff ground connector 10 as used to mount a circuit board 100 in a piece of electronic equipment, such as a personal computer, in a position separate from the chassis 200 thereof. Standoff ground connector 10 is secured to the chassis 200 by insertion upward through a rectangular aperture 202 of dimensions L×W therein, these dimensions, of course, being the same as those identified above for connector 10. Most conveniently, aperture 202 is square, so that L and W may be the same for both aperture 202 and connector 10, whereby connector 10 may be inserted in any orientation in the aperture 202.

Figure 5:
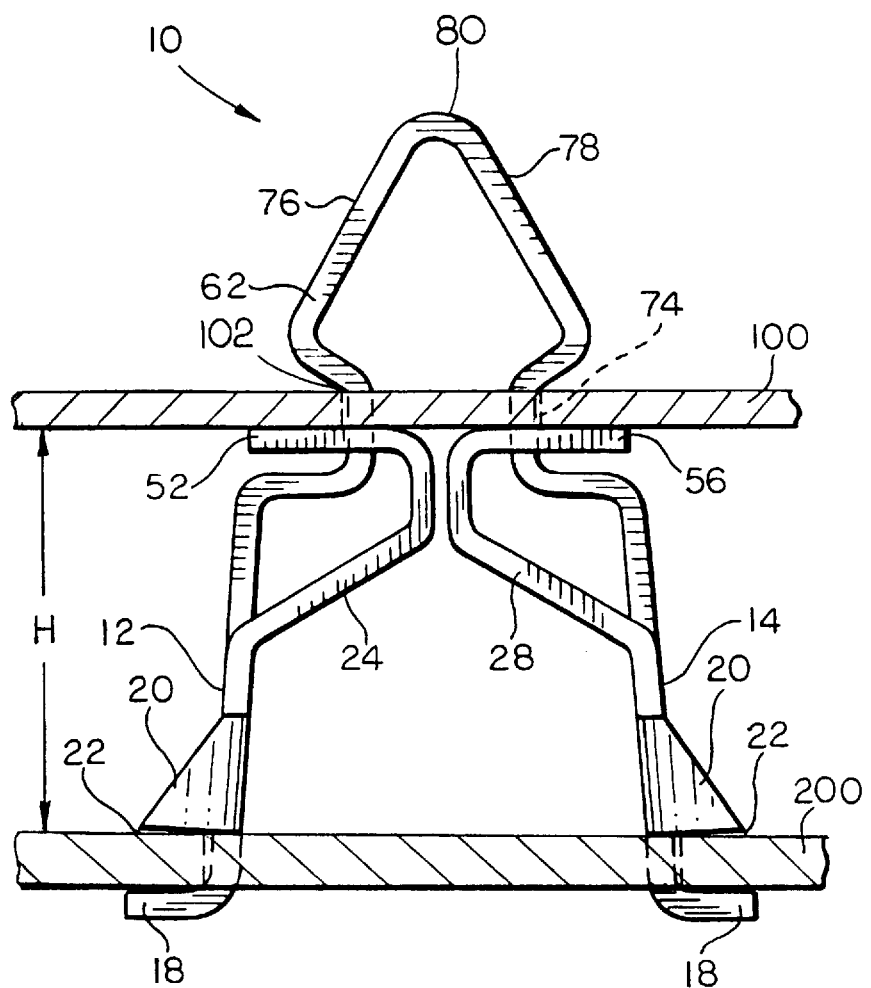
FIG. 5 is a side view of the connector as shown in FIG. 4.

FIG. 5 is a side view of the standoff ground connector 10 in the position of use shown in FIG. 4. The connector 10 is fixed to the chassis 200, viewed in cross section, by feet 18 and wedge-shaped locking members 20 on legs 12, 14 which prevent movement of the connector 10 relative to the chassis 200 once bases 22 of wedge-shaped locking members 20 have snapped through aperture 202. Circuit board 100, also viewed in cross section, is resiliently engaged by portion of reduced width 74 of arrowhead shaped mounting device 62 and urged against horizontal portions 52, 54, 56, 58 of pre-load form members 31, 33.

During the installation of standoff ground connector 10 to the circuit board 100, as the aperture 102 of the circuit board 100 is inserted through progressively wider portions of arrowhead shaped mounting device 62, the oblique walls 76, 78 are forced toward each other and the integral characteristic of standoff ground connector 10 causes shanks 24, 28 to be forced toward each other thereby reducing or eliminating gap 48 and likewise shanks 26, 30 to be forced toward each other thereby reducing or eliminating gap 50. However, as the circuit board 100 moves from the widest portion of arrowhead shaped mounting device 62 to the portion of reduced width 74, the resilient characteristic of standoff ground connector 10 causes the shanks 24, 26, 28, 30 of pre-load form members 31, 33 to move or to snap horizontally outwardly thereby effecting a wiping motion across the circuit board 100 thereby assuring a secure electrical connection. Likewise, as oblique walls 76, 78 flex outwardly, a detent connection is formed with the circuit board 100 thereby assuring a secure mechanical connection.

The present standoff ground connector 10 may be made in any size depending on the space requirements of the equipment in which it is to be used.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A standoff ground connector for mounting a circuit board to a chassis in a piece of electronic equipment in a standoff grounded position relative thereto, said standoff ground connector comprising:
    a first leg and a second leg;
    means on said first and second legs for attaching said standoff ground connector fixedly to said chassis;
    at least one pre-load form member extending between said first and second legs, said at least one pre-load form member including a first shank extending from said first leg and a second shank extending from said second leg, said first shank and said second shank being resilient and including portions forming a support for the circuit board; and
    means for resiliently engaging an aperture of a circuit board and urging the circuit board against said support formed by said first shank and said second shank.

2. A standoff ground connector as claimed in claim 1 wherein said first leg and said second leg each have a first side and a second side, and wherein said at least one pre-load form member is a first and a second pre-load form member, said first pre-load form member and said second pre-load form member each including a first shank extending from said first leg and a second shank extending from said second leg.

3. A standoff ground connector as claimed in claim 2 wherein said means for detent engaging an aperture of the circuit board includes an arrowhead shaped portion contiguous with a portion of reduced width, wherein the arrowhead shaped portion is inserted into an aperture of the circuit board and the portion of reduced width resiliently engages the aperture and urges the circuit board against said first and second pre-load form members.

4. A standoff ground connector as claimed in claim 3 wherein said first and second pre-load form members each include a gap between said first and second shanks in an unbiased position, and wherein an inward force on said means for engaging an aperture of the circuit board causes said first and second shanks to move toward each other thereby reducing a width of said gap.

5. A standoff ground connector as claimed in claim 4 wherein as the aperture of the circuit board moves from said arrowhead shaped portion to said portion of reduced width, said arrowhead shaped portion spreads apart thereby urging said first and second shanks apart, thereby causing a wiping motion of said first and second shanks against the circuit board.

6. A standoff ground connector as claimed in claim 1 wherein said means for attaching comprise a foot and a wedge-shaped locking member having a base on each of said first and second legs, said bases of said wedge-shaped locking members being adjacent to, but separated from, said feet on their respective legs, and said wedge-shaped locking members being oriented on said first and second legs in a direction toward said support.

7. A standoff ground connector as claimed in claim 1 wherein said first leg and said second leg each have a first side and a second side and wherein said means for attaching comprise a foot on each of said first and second legs, and a wedge-shaped locking member having a base on each side of each of said first and second legs, said bases of said wedge-shaped locking members being adjacent to, but separated from, said foot on each of said first and second legs, and said wedge-shaped locking members being oriented on said first and second legs in a direction toward said support.

8. A standoff ground connector as claimed in claim 1 integrally formed from a rectangular piece of metal sheet material.

9. A standoff ground connector as claimed in claim 8 wherein said metal sheet material is tin-plated steel or stainless steel.

\* \* \* \* \*